(12) United States Patent
Wever et al.

(10) Patent No.: US 7,047,162 B1
(45) Date of Patent: May 16, 2006

(54) COMPUTER ASSISTED METHOD FOR PARTITIONING AN ELECTRIC CIRCUIT

(75) Inventors: Utz Wever, München (DE); Qinghua Zheng, Taufkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/308,478

(22) PCT Filed: Nov. 7, 1997

(86) PCT No.: PCT/DE97/02600

§ 371 (c)(1),
(2), (4) Date: May 17, 1999

(87) PCT Pub. No.: WO98/24039

PCT Pub. Date: Jun. 4, 1998

(30) Foreign Application Priority Data

Nov. 18, 1996 (DE) ................................. 196 47 622

(51) Int. Cl.
*G06F 17/10* (2006.01)
*G06F 17/50* (2006.01)

(52) U.S. Cl. ............................................. 703/2; 716/7
(58) Field of Classification Search ................. 703/13, 703/14, 15, 16, 2; 716/7; 712/13
See application file for complete search history.

(56) References Cited

U.S. PATENT DOCUMENTS

| | | | | |
|---|---|---|---|---|
| 5,587,922 A * | 12/1996 | Hendrickson et al. | ........ | 712/13 |
| 5,748,844 A * | 5/1998 | Marks | ........................... | 706/45 |
| 5,761,077 A * | 6/1998 | Shackleford | .................... | 716/7 |
| 5,805,459 A * | 9/1998 | Kapoor | ......................... | 703/14 |
| 6,031,979 A * | 2/2000 | Hachiya | ........................ | 716/7 |
| 6,212,668 B1 * | 4/2001 | Tse et al. | ........................ | 716/7 |

OTHER PUBLICATIONS

Kapp et al., "Improved Cost Function for Static Partitioning of Parallel Circuit Simulations Using Conservative Sychronization Protocol", Proceedings Ninth Workshop on Parallel and Distributed Simulation, pp. 78-85, Jun. 1995.*
Peinado et al., "Parallel Go With the Winners' Algorithms in the LogP Model", Proceedings International Parallel Processing Symposium, pp. 656-664, Apr. 1997.*

(Continued)

*Primary Examiner*—Russell Frejd
(74) *Attorney, Agent, or Firm*—Schiff Hardin LLP

(57) ABSTRACT

A partition of an electrical circuit is formed in that the electrical circuit is imaged on a graph (102) and weighting values are allocated (103) to the edges of the graph. The weighting values describe a required calculating outlay for determining electrical descriptive quantities for the respective element of the electrical circuit represented by the edge. A check is carried in iterative methods to see whether, proceeding from preceding iteration steps, a sum of the weighting values of edges grouped together lies between a first threshold and a second threshold by adding a further edge. When this is the case, then a further check is carried out to see whether a plurality of terminals of the elements within the partition to elements outside the partition is increased by adding new edges. When this is not the case, then the respective edge is also incorporated into the partition.

10 Claims, 2 Drawing Sheets

OTHER PUBLICATIONS

Buch et al., "A Parallel Graph Partitioner on a Distributed Memory Processor", Proceedings Fifth Symposium on Frontiers of Massively Parallel Computation, pp. 360-366, Feb. 1995.*

Talbi et al., E.-G. A Parallel Genetic Algorithm for the Graph Partitioning Problem, Proceedings of the 5th International Conference on Supercomputing, Jun. 1991, pp. 312-320.*

U. Kleis, et al., *Domain Decomposition Methods for Circuit Simulation,* Proceedings of the 8th Workshop on Parallel and Distributed Simulation, PADS, Edinburgh, UK (Jul., 1994), pp. 183-186.

U. Wever, et al. *Parallel Transient Analysis for Circuit Simulation,* Proceedings of the 29th Annual Hawaii International Conference on System Sciences (1946), pp. 442-447.

B. Riess, et al., *Partitioning Very Large Circuits Using Analytical Placement Techniques,* Proceedings of the 31st ACM/IEEE Design Automation Conference (1994), pp. 646-51.

P. Johannes, *Partitioning of VLSI Circuits and Systems,* 33rd Design and Automation Conference, Las Vegas (Jun. 3-7, 1996), pp. 83-87.

J. Cong, et al., *A Parallel Bottom-up Clustering Algorithm with Applications to Circuit Partitioning in VLSI Design,* In: 30th Design Automation Conference, Jun. 14-18, 1993, pp. 755-760.

J. Li, et al., *New Spectral Linear Placement and Clustering Approach,* 33rd Design Automation Conference, Las Vegas (Jun. 3-7, 1996), pp. 88-93.

T. Kage, et al., *A Circuit Partitioning Approach for Parallel Circuit Simulation,* IEICE Trans Fundamentals, vol. E77-A, No. 31 (1993), pp. 461-465.

G. Hung, et al., *Improving the Performance of Parallel Relaxation-Based Circuit Simulators,* IEEE Transactions on Computer-Aided Design of Integrated Circuits and Systems, New York (Nov. 12, 1993), No. 11, pp. 1762-1774.

* cited by examiner

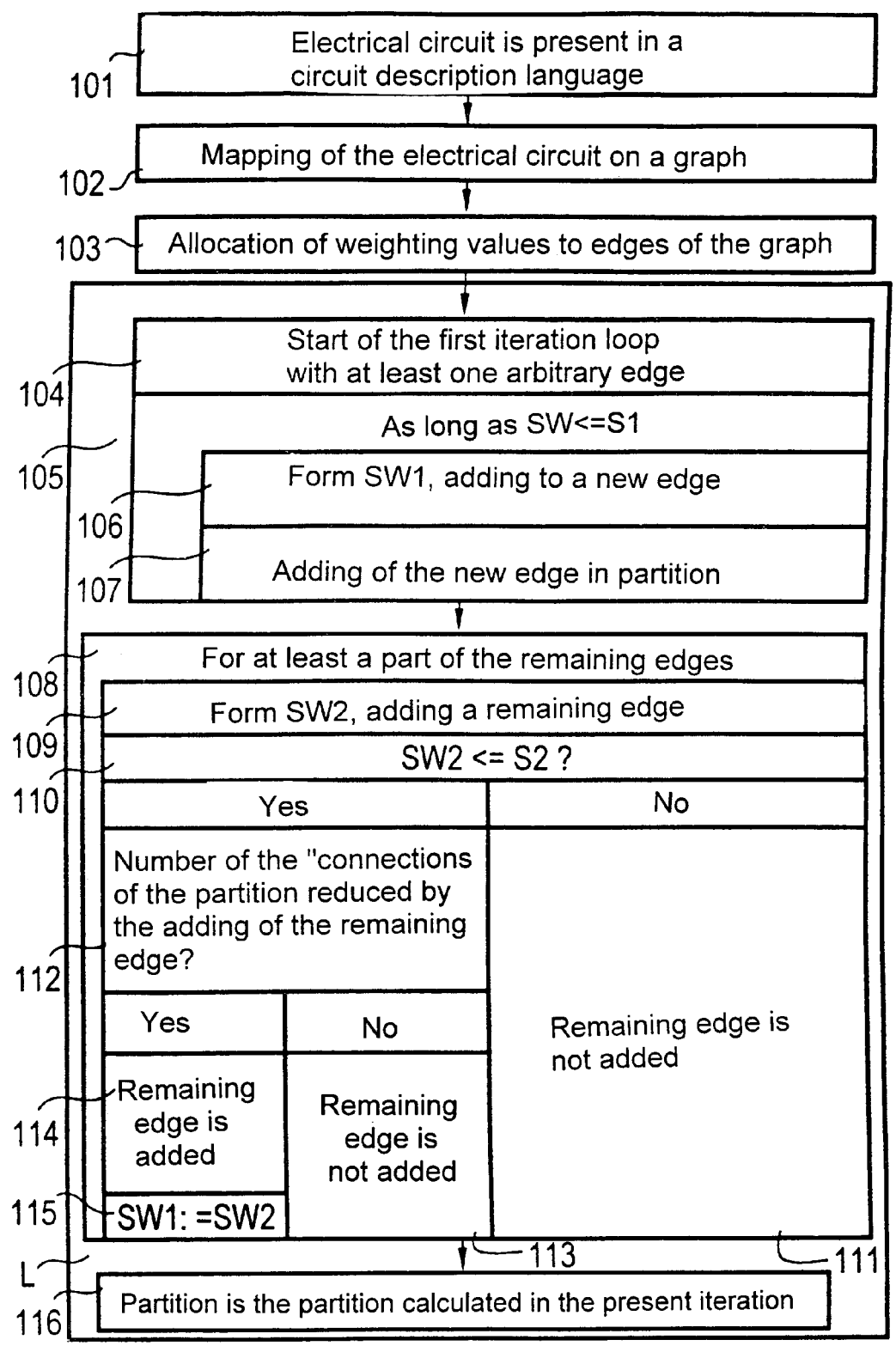

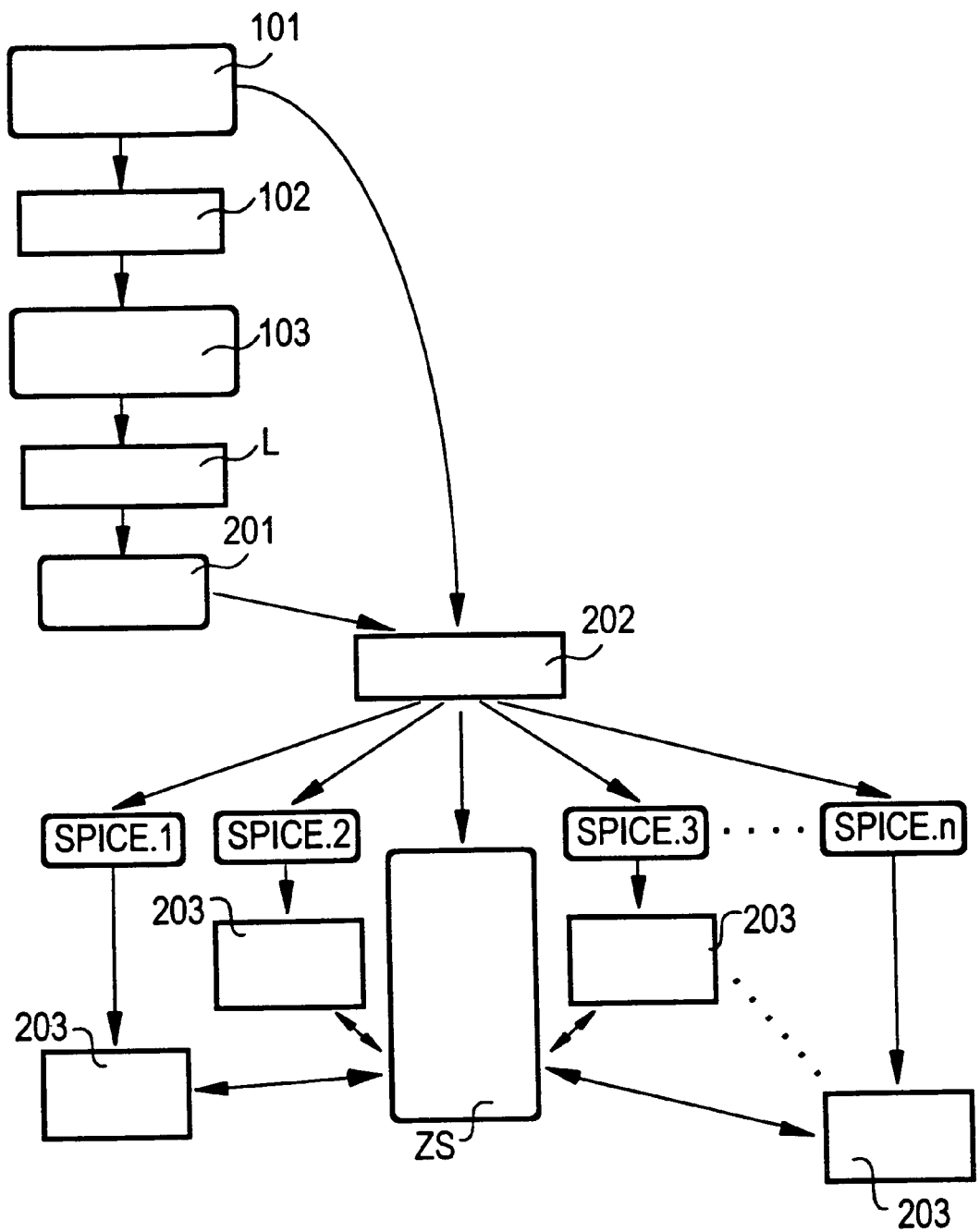

COMPUTER ASSISTED METHOD FOR PARTITIONING AN ELECTRIC CIRCUIT

The present invention relates to computer-implemented systems for simulating electronic or electrical circuits.

BACKGROUND OF THE INVENTION

In circuit simulation of very large circuits, i.e. of circuits having a great plurality of elements, a serial processing, i.e. the determination of the circuit quantities by a computer, is extremely time-consuming. Even vector computers that are very expensive in terms of operation have an immense need of calculating capacity and time for determining the electrical descriptive quantities for a circuit that comprises a few 100,000 transistors.

In order to avoid the serial implementation of a circuit simulation for this reason, the electrical circuit can be divided into a plurality of parts that are then respectively processed by different computers or, respectively, processors, this leading to a parallel implementation of the circuit simulation.

In order, however, to achieve an optimally good parallelization of the determination of the electrical descriptive quantities for the electric circuit, it is advantageous to consider the following two criteria in the partitioning of the electrical circuit into a plurality of parts. First, it is of considerable significance that all partitions of the electrical circuit that are formed are of the same size insofar as possible, in order to thereby intensify the effect that can be achieved by the parallelization. When, for example, one partition is orders of magnitude larger than the remaining partitions, then the processing of the significantly larger partition is in turn far more calculation-consuming then the processing of the remaining partitions. Second, it is important in the partitioning that only a slight plurality of connections exists between the individual partitions insofar as possible since, in known methods for "parallelized" circuit simulation, the required transmission capacity, i.e. the required communication between the computers or, respectively, processors that respectively process one partition, increases substantially with an increasing number of existing connections between the partitions.

A language for the textual description of an electrical circuit that can be processed by a computer is the circuit simulation language SPICE See I Hoefer, et al., *SPICE Analyseprogramm fur electronische Schaltungen*, Springer, Berlin (1985), pp. 7–22.

U. Kleis, et al., *Doman Decomposition Methods for Circuit Simulation*, Proceedings of the 8th Workshop on Parallel and Distributed Simulation, PADS, Edinburgh, UK (July, 1994), pp. 183–86, and U. Wever, et al., *Parallel Transient Analysis for Circuit Simulation*, Proceedings of the 29th Annual Hawaii International Conference on System Sciences (1946), pp. 442–47 describe how a parallelized circuit simulation can be implemented, assuming an arbitrary number of partitions of the electrical circuit exist. The way in which the partitions can be determined is not described in these documents.

B. Riess, *Partitioning Very Large Circuits Using Analytical Placement Techniques*, Proceedings of the 31st ACM/IEEE Design Automation Conference (1994), pp. 646–51 discloses a global partitioning method on what is referred logic level, which is also referred to as gate level.

Discrete events are described on the logic level, but no steady dynamic property of an electrical circuit on what is referred to as the transistor level, i.e. on the actual physical level of the electrical circuit, can be described with these.

The results of a circuit simulation that ensues on the logic level is thus unreliable and imprecise for certain applications since an exact time course of the electrical signals that occur in the electrical circuit cannot be taken into consideration.

Further, a description of the individual gates is required for the circuit simulation, this having to be determined first before the method can be implemented.

An overview of various partitioning rules can be found in P. Johannes, *Partitioning of VLSI Circuits and Systems*, 33rd Design and Automation Conference, Las Vegas (Jun. 3–7, 1996), pp. 83–87.

A parallelized method for clustering an electrical circuit according to what is referred to as the bottom-up principle is disclosed by J. Cong, et al., *A Parallel Bottom-Up Clustering Algorithm with Applications to Circuit Partitioning in VLSI Design*, 30th ACM/IEEE Design Automation Conference, Jun. 14–18, 1993, pp. 755–760.

SUMMARY OF THE INVENTION

The present invention provides method for partitioning an electrical circuit that directly considers the elements of the electrical circuit on the transistor level.

To that end, in an embodiment the invention provides a computer-supported method for partitioning an electrical circuit,
  whereby the electrical circuit is imaged onto a graph that exhibits the same topology as the electrical circuit,
  whereby edges of the graph have weighting values allocated to them with which a required calculating outlay for determining electrical descriptive quantities for elements of the electrical circuit that are represented by the respective edge is described,
  whereby a first sum value of the weighting values of the edges is calculated for edges coupled to one another and, in further iterations, the first sum value is respectively formed upon addition of at least one further edge until the respectively calculated, first sum value is greater than a prescribable, first threshold,
  whereby a partition of the electrical circuit is formed by the edges taken into consideration in the formation of the first sum value,
  whereby the following steps are implemented for at least a part of the remaining edges that do not lie in the partition and that are coupled to at least one edge of the partition:
  a second sum value is determined that derives from the sum of the first sum value and at least one weighting value of at least one remaining edge,
  when the second sum value is smaller than a prescribable second threshold, and
  when a plurality of edges that were taken into consideration in the formation of the second sum value that are coupled to edges that were not taken into consideration in the formation of the second sum value is smaller than a plurality of edges of the partition that are coupled to the remaining edges, then
  the remaining edge is allocated to the partition and the second sum value is allocated to the first sum value, and
  whereby the partition is formed by the edges taken into consideration in the formation of the second sum value 1.

In the method, the electrical circuit is imaged onto a graph that exhibits the same topology as the electrical circuit. The edges of the graph are weighted with weighting values that describe in approximately required calculating outlay for determining electrical descriptive quantities for the element of the electrical circuit respectively represented by the edge. A partition for the electrical circuit is formed in the graph in that edges coupled with one another are combined to form the partition at the beginning of the method until the sum of the weighting values of the combined edges is greater than a first, prescribable threshold. When the first threshold is reached, the partition is then respectively expanded by further, remaining edges when the sum of the weighting values of all edges, including the edges to be potentially newly added, is smaller than a prescribable, second threshold, and when the plurality of edges of the partition that are connected to nodes that do not lie within the partition is reduced by the addition of at least one new edge.

The method exhibits a number of substantial advantages compared to the method disclosed by B. Riess in *Partitioning Very Large Circuits Using Analytical Placement Techniques*, Proceedings of the $31^{st}$ ACM/IEEE Design Automation Conference (1994) pp. 646–651.

Since the method works directly of the transistor level of the electrical circuit, the results achieved by the method are substantially more exact and dependable given a later circuit simulation employing of the partitions that have been determined in accordance with the invention.

In an embodiment of the invention, at the beginning of the method, a grouping of elements of the electrical circuit is executed for which it is respectively found that these elements are allocated in common to a partition.

In an embodiment of the invention, at least one of the following rules is applied in the grouping of the elements of the electrical circuit:

elements of a controlled source, at least one controlling element, and the controlled source are allocated in common to a partition, connecting loops in the electrical circuit that only contain at least one voltage source and at least one counter-inductance are allocated in common to a partition, no shorts dare arise due to the partitioning.

In an embodiment of the invention, a plurality of edges of the graph have a common weighting value allocated to them.

In an embodiment of the invention, the graph of the partition is mapped onto the electrical circuit, whereby the partition comprises the elements of the electrical circuit corresponding to the implemented partitioning.

In an embodiment of the invention, the method comprises the steps of iterating the method a plurality of times thereby forming a plurality of partitions, and determining electrical descriptive quantities for the elements of the electrical circuit for each partition, at least a part of the partitions being processed in parallel on a plurality of computers and/or processors.

In an embodiment of the invention, the parallel processing of the partitions is centrally controlled.

In an embodiment of the invention, at least a part of the partitions is centrally controlled in such a way that all terminals of the respective partition are coupled only to a central control unit, and a communication of data ensues only between the central control unit and at least the part of the partitions.

In an embodiment of the invention, a voltage source is additionally allocated at least to a part of the terminals of the respective partition, the value of said additional voltage predetermined by the central control unit during the determination of the electrical descriptive quantities.

In an embodiment of the invention, a resistor is additionally allocated at least to a part of the terminals of the partition.

For prescribable elements of the electrical circuit, it is advantageous to determine at the beginning of the method that the elements are grouped in common into a partition. As a result of this development of the method, it becomes possible to assure that, for example given controlled sources, both the controlling elements as well as the controlled source can be processed in common in one partition. This development also makes it possible to likewise allocate connecting leaps in the electrical circuit that only comprise at least one voltage source and/or at least one inductance in common in one partition. This procedure also makes it possible to avoid shorts that may potentially occur due to the partitioning.

Due to the development of the method that a plurality of edges of the graph have a common weighting value allocated to them, the implementation of the method is further accelerated by a computer since, given this development, a lower number of weighting values must be taken into consideration during the course of the method.

It is also advantageous to form a plurality of partitions for the electrical circuit, to again image the corresponding graphs of the partitions onto the electrical circuit for the partitions, and to process the arising partitions of the electrical circuit in parallel on different computers or, respectively, processors. As a result of this parallelization, a circuit simulation of an extremely large circuit can be implemented significantly faster then given a purely "serial" circuit simulation.

It is also advantageous in the parallelized circuit simulation, to control the processing of the individual partitions centrally. In this way, a controlled circuit simulation is realized with optimally low communication outlay.

It is also advantageous to additionally provide the individual terminals of the partitions that are coupled to components that do not lie in their partition with a voltage source and a resistor, whereby the voltage source has the electrical boundary descriptive quantities respectively allocated to it by a central control unit that controls the parallelized processing of the partitions. As a result of the resistor that is respectively provided in the terminals, the convergence of the circuit simulation is assured during the parallelized circuit simulation, the value thereof being dynamically adapted by the control unit.

BRIEF DESCRIPTION OF THE DRAWINGS

These and other features and aspects of the invention will become clear in the following detailed description of a few typical exemplary embodiments with reference to the accompanying drawings.

FIG. 1 is a flow chart wherein the individual method steps of the method are shown;

FIG. 2 is a sketch that shows various developments of the method.

DETAILED DESCRIPTION OF THE PRESENTLY PREFERRED EMBODIMENTS

In accordance with the invention, electrical circuits that comprise an extremely great plurality of elements can be parallelized into an arbitrary plurality of partitions and a processing of the individual partitions on different computers or, respectively, processors that implement a circuit simulation. The implementation of the overall circuit simulation can thus be considerably speeded up.

In order for the parallelization, however, to be designed as optimally as possible, the individual partitions must be carefully defined.

It is thereby important, first to make sure of an approximately uniform size of the partition and, second, to make sure that the individual partitions do not comprise an excessively great plurality of terminals "toward the outside", for example couplings to other elements not lying in the partition.

Electrical circuits for processing within the framework of a circuit simulation by a computer are usually present in a circuit description language 101, for example in what is referred to as the language SPICE, which is described in L. Hoefer, et al. in *SPICE Analyseprogramm for electronische Schaltungen*, Springer, Berlin (1985), pp. 7–22.

The method, however, is definitely not limited to a description of the electrical circuit in a circuit description language and is likewise not limited to the employment of the ecific circuit description language SPICE.

With reference now to the figures, in a first method step 102, the electrical circuit is imaged onto a graph that exhibits the same topology as the electrical circuit. This ensues, for example, proceeding from the electrical circuit present in the circuit description language SPICE. The graph comprises the corresponding nodes corresponding to the topology of the electrical circuit. The individual elements of the electrical circuit are represented by edges between the nodes of the graph.

It is advantageous in a development of the method to mark individual elements of the electrical circuit at the beginning of the method, i.e. to determine for the corresponding, marked elements that the marked elements are respectively allocated in common to one partition in the further method. Various markings can assign various elements to different partitions. It is also provided to mark elements only in a way that is interpreted such by the computer that implements the method that the respectively paired elements are allocated to one partition.

It is thereby advantageous, for example, to take the following specific instances of an electrical circuit into consideration. When an electrical circuit contains controlled sources, for example controlled current sources or controlled voltage sources, then it is advantageous that both the controlling elements as well as the controlled source are contained in common in one partition for the later circuit simulation.

It is further advantageous to likewise allocated coupled inductances to a common partition. It is also important to take into consideration in a development of the method that no shorts dare occur due to the partitioning and the algorithmic processing thereof with a computer.

In a further step 103, weighting values G are allocated to the edges. The weighting values G describe what calculating outlay is approximately expected for determining electrical descriptive quantities for the respective element of the electrical circuit that is represented by the edge to which the weighting value G is respectively assigned.

One criterion for the required calculating outlay is to be seen, for example, in the plurality of code lines required for determining the electrical descriptive quantities for the respective, specific element within the framework of the circuit simulation. It should be noted here as a rough rule that the determination of the electrical descriptive quantities for transistors is substantially greater than the outlay for determining the electrical descriptive quantities for an electrical resistor or for a capacitor as well. The selection of the weighting values G, however, basically is not critical merely represents an approximate size relationship of the required calculating outlay. It is even adequate to allocate a high weighting value G, for example, the weighting value G=300 to, for example, an edge that represents a transistor and to allocate a low weighting value, for example a weighting value G=1 or even a weighting value G=0, to the edges that represent a resistor or a capacitor.

What are to be understood as electrical descriptive quantities in this conjunction are, for example, the corresponding currents and voltages of an element of the electrical circuit.

A first iteration loop implemented thereafter contains the following method steps.

An arbitrary edge of the graph is selected 104 at the beginning of the first iteration loop. However, it is likewise provided in one version of the method to select an arbitrary plurality of edges of the graph coupled to one another in this method step, as a result whereof the number of required iterations in the first iteration loop 105, 106, 107 is substantially reduced. Two method steps 106, 107 described later are implemented, proceeding from the selected edge or, respectively, proceeding from the set of selected edges, until the first sum value SW1 is greater than a freely prescribable, first threshold S1.

The first sum value SW1 is formed for respectively at least one new edge that was not contained in the set of considered edges from the last iteration or, respectively, that was not contained in the selected set of edges at the beginning of the first iteration loop. The first sum value SW1 is formed, for example, by summation of the weighting values G of all of the edges that are utilized 106 for the formation of the first sum value SW1.

When the first sum value SW1 is not greater then the first threshold S1, a partition of the electrical circuit derives from the edges that were utilized 107 for the formation of the first sum value SW1, and the method steps of the first iteration loop are re-implemented, now with the "new" partition.

When, however, the first sum value SW1, is greater then the first threshold S1, then the partition formed in the iteration step preceding in time is employed, and method steps of a further, second iteration loop are implemented for the partition that is formed.

Proceeding from the respective partition, the following method steps designated 108 are implemented in each iteration step of the second iteration loop for at least a part of the remaining edges of the electrical circuit. What is to be understood by a remaining edge in this context is an edge that is not already contained in the partition itself and that is coupled to an edge that is contained in the partition, for example via a node in the partition.

A second sum value SW2 is formed at 109 from the weighting values of the partition and the weighting values of at least one additional, remaining edge. This ensues, for example, by simple summation over the weighting values G allocated to the corresponding edges.

A check is now carried out to see whether the second sum value SW2 that has been formed is greater than a freely prescribable, second threshold S2 that is higher than the first threshold S1 at 110.

When the second sum value SW2 is greater then the second threshold S2, then this means that the partition is larger than a prescribable region that can be tolerated. A tolerance region for the size or, respectively, for the maximum required processing outlay that can be tolerated in the circuit simulation of the respective partition is thus described by the first threshold S1 and by the second threshold S2.

When, thus, the second sum value SW2 is greater than the second threshold S2, then the corresponding edge is not added at 111 to the partition.

When, however, the second sum value SW2 is not greater then the second threshold S2, then a further check is carried out for the at least one remaining edge to see whether a plurality of edges that were taken into consideration in the formation of the second sum value SW2 and that are coupled to edges that were not taken into consideration in the formation of the second sum value SW2 is smaller than a plurality of edges of the partition that are couple at 112 to the remaining edges.

As can be seen, this comparison corresponds to the plurality of "section points" of every partition with another partition or, respectively, with another element of the electrical circuit as well that is not contained in a partition or, respectively, with a central control unit (described later).

When, as can be seen, the number of terminals for each partition thus becomes greater—by adding the at least one remaining edge—then the plurality of terminals of the partition that already previously existed, then the corresponding edge is not added at 113. When, however, the new plurality of terminals has been reduced, then the corresponding, remaining edge is added at 114 to the partition. For this case, further, the first sum value SW1 for the next iteration of the second iteration loop is occupied with the value of the second sum value SW2.

The second iteration loop is implemented for an arbitrarily prescribable plurality of remaining edges. It is likewise provided in a development of the method to simply employ the information as to whether all remaining edges have been taken into consideration in the second iteration loop as abort criterion for the second iteration loop. When this is the case, then the second iteration loop is ended in this development. After abort or, respectively, conclusion of the second iteration loop, the partition that was formed in the last iteration of the second iteration loop is employed at 116 as partition of the electrical circuit.

Upon employment of the original description of the electrical circuit, for example in the circuit description language SPICE, the partition is imaged into a syntax to be further-processed for the computer, for example again in the circuit description language SPICE. In this imaging, the information of the respective partition for the respective element of the electrical circuit is taken into consideration, for example, marking the respective element.

As a result of this back-imaging at 201 (see FIG. 2), thus, a list with the circuit elements of the electrical circuit as well as with the couplings and the respective indication of the partition to which the respective element was allocated in turn arises for the specific cases of employing the circuit description language SPICE.

It is advantageous in a development of the method to implement this method for an arbitrary number of partitions, i.e. the electrical circuit is sub-divided into an arbitrary plurality of partitions. Given this development, partition-specific lists with the elements of the electrical circuit in the circuit description language SPICE arise 202 according to the plurality of partitions formed. A parallelization of the circuit simulation of the electrical circuit that is advantageous in a development of the method is now achieved in that the electrical descriptive quantities for the elements of the electrical circuit are separately identified for each partition, whereby at least a part of the partitions can be processed in parallel on a plurality of computers and/or processors. This corresponds to a parallelization of the circuit simulation.

It is also provided in a development of the method to allocate a common weighting value to a plurality of edges of the graph. The required calculating outlay is reduced as a result of this procedure.

Methods for parallelized circuit simulation on distributed processors or, respectively, distributed computers are known, for example, from the document [2] and [3]. These can be applied without limitation to the partitions formed by the method.

It is also provided in a development of the method to centrally control the parallel processing of the partitions via a central control unit ZS. This means, for example, that the communication of the individual partitions in the method of the circuit simulation as described in documents [2] and [3], i.e. the communication of data ensues only between the central control unit ZS and the part of the partitions that is centrally controlled.

FIG. 2 symbolically shows the parallelized processing by a plurality of SPICE data files SPICE.1, SPICE.2, SPICE.3 through SPICE.N. The individual descriptions of the partitions are contained in these SPICE data files in the circuit description language SPICE.

A circuit simulation is implemented 203 for the respective partition, for example centrally controlled by the central control unit ZS.

It is also provided in a development of the method to additionally allocate a voltage source at least to a part of the terminals of the respective partition that is processed in the framework of the parallelized circuit simulation, a corresponding value being respectively allocated to this additional voltage source by the central control unit ZS in the framework of the known method. In order to assure the convergence of the iterative method from document [2] and [3], it is advantageous to additionally provide a resistor at least at a part of the terminals of the respective partitions, the value of said resistor being dynamically adapted by the control unit ZS.

Although modifications and changes may be suggested by those skilled in the art, it is the intention of the inventors to embody within the patent warranted hereon all changes and modifications as reasonably and properly come within the scope of their contribution to the art.

The following publications were cited within the framework of this document:

[1] I. Hoefer, H. Nielinger, SPICE Analyseprogramm für elektronische Schaltungen, Springer Verlag, Berlin, B, ISBN 3-540-15160-5, pp. 7 through 22, 1985.

[2] U. Wever, Q. Zheng et al, Domain Decomposition Methods for circuit Simulation, Proceedings of the 8th Workshop on Parallel and Distributed Simulation, PADS '94 Edinburgh, Scotland, UK, periodical, pp. 183–186. Juli 1994

[3] U. Wever & Q. Zheng, Parallel Transient Analysis for Circuit Simulation, Proceedings of the 29th Annual Hawaii International Conference on System Sciences, periodical, pp. 442 through 447, 1996

[4] B. Riess et al, Partitioning Very Large Circuits Using Analytical Placement Techniques, Proceedings of the 31st ACM/IEEE Design Automation Conference, pp. 646 through 651, 1994

[5] F. Johannes, Partitioning of VLSI Circuits and Systems, 33rd Design Automation Conference, 3–7 June, Las Vegas, pp. 83–87, 1996

[6] J. Cong et al, A Parallel Bottom-Up Clustering Algorithm with Applications to Circuit Partitioning in VLSI Design, In: 30rd Design Automation Conference, 14–18 June, pp. 755–760, 1993

What is claimed is:

1. A computer-supported method for partitioning an electrical circuit comprising the steps of:
   imaging the electrical circuit is imaged onto a graph that exhibits the same topology as the electrical circuit;
   allocating weighting values to edges of the graph with which a required calculating outlay for determining electrical descriptive quantities for elements of the electrical circuit that are represented by the respective edge is described;
   a first sum value of the weighting values of the edges for edges coupled to one another and, in further iterations, the first sum value is respectively formed upon addition of at least one further edge until the respectively calculated, first sum value is greater than a prescribable, first threshold;
   forming a partition of the electrical circuit by the edges taken into consideration in the formation of the first sum value;
   for at least a part of the remaining edges that do not lie in the partition and that are coupled to at least one edge of the partition;
   determining a second sum value that derives from the sum of the first sum value and at least one weighting value of at least one remaining edge;
   when the second sum value is smaller than a prescribable second threshold, and when a plurality of edges that were taken into consideration in the formation of the second sum value that are coupled to edges that were not taken into consideration in the formation of the second sum value is smaller than a plurality of edges of the partition that are coupled to the remaining edges, then
   allocating the remaining edge to the partition and allocating the second sum value to the first sum value, and
   forming the partition by the edges taken into consideration in the formation of the second sum value.

2. The method according to claim 1, wherein, at the beginning of the method, grouping of elements of the electrical circuit for which it is respectively found that these elements are allocated in common to a partition.

3. The method according to claim 2, wherein at least one of the following rules is applied in the grouping of the elements of the electrical circuit:
   elements of a controlled source, at least a controlling element and the controlled source, are allocated in common to a partition,
   connecting loops in the electrical circuit that only contain at least one voltage source and at least one counter-inductance are allocated in common to a partition,
   no shorts dare arise due to the partitioning.

4. The method according to claim 1, wherein a plurality of edges of the graph have a common weighting value allocated to them.

5. The method according to claim 1, wherein the graph of the partition is imaged onto the electrical circuit, whereby the partition comprises the elements of the electrical circuit corresponding to the implemented partitioning.

6. The method according to claim 1, comprising the further steps of:
   iterating the method a plurality of times thereby forming a plurality of partitions, and
   determining electrical descriptive quantities for the elements of the electrical circuit for each partition, at least a part of the partitions being processed in parallel on the plurality of computers and/or processors.

7. The method according to claim 6, wherein the parallel processing of the partitions is centrally controlled.

8. The method according to claim 7, wherein at least a part of the partitions are centrally controlled in such a way that all terminals of the respective partition are coupled only to a central control unit and a communication of data ensues only between the central control unit and at least the part of the partitions.

9. The method according to claim 8, a voltage source is additionally allocated at least to a part of the terminals of the respective partition, the value of said additional voltage source predetermined by the central control unit during the determination of the electrical descriptive quantities.

10. The method according to claim 9, wherein a resistor is additionally allocated at least to a part of the terminals of the respective partition.

* * * * *